(12) United States Patent
Rusanov

(10) Patent No.: US 10,370,239 B2
(45) Date of Patent: Aug. 6, 2019

(54) HEATING APPARATUS FOR A MEMS SENSOR

(71) Applicant: Robert Bosch GmbH, Stuttgart (DE)

(72) Inventor: Radoslav Rusanov, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 346 days.

(21) Appl. No.: 15/346,705

(22) Filed: Nov. 8, 2016

(65) Prior Publication Data

US 2017/0129768 A1 May 11, 2017

(30) Foreign Application Priority Data

Nov. 10, 2015 (DE) .................. 10 2015 222 072

(51) Int. Cl.
| | |
|---|---|
| *B81B 3/00* | (2006.01) |
| *H05B 3/10* | (2006.01) |
| *B81B 7/00* | (2006.01) |
| *B81B 7/02* | (2006.01) |

(52) U.S. Cl.
CPC .......... *B81B 3/0021* (2013.01); *B81B 7/0087* (2013.01); *H05B 3/10* (2013.01); *B81B 2201/0214* (2013.01); *B81B 2203/0127* (2013.01)

(58) Field of Classification Search
CPC ................ B81B 3/0021; B81B 7/0087; B81B 2201/0214; B81B 2203/0127
See application file for complete search history.

(56) References Cited

U.S. PATENT DOCUMENTS

| | | | | |
|---|---|---|---|---|
| 5,500,569 | A * | 3/1996 | Blomberg | ................ H01K 1/02 313/522 |
| 5,644,676 | A * | 7/1997 | Blomberg | ................ G01J 5/522 219/544 |
| 5,827,438 | A * | 10/1998 | Blomberg | ................ G01J 3/108 219/544 |
| 5,928,549 | A * | 7/1999 | Hitzigrath | ................ H05B 3/24 219/538 |
| 6,450,025 | B1 | 9/2002 | Wado et al. | |
| 8,410,560 | B2 | 4/2013 | Ali et al. | |
| 8,686,555 | B2 | 4/2014 | Yaralioglu et al. | |
| 8,689,623 | B2 | 4/2014 | Eto et al. | |
| 9,254,999 | B2 | 2/2016 | Chou et al. | |
| 2003/0010773 | A1* | 1/2003 | Fritz | ...................... H05B 3/342 219/529 |
| 2004/0178185 | A1* | 9/2004 | Yoshikawa | ............. F23Q 7/001 219/270 |

(Continued)

FOREIGN PATENT DOCUMENTS

JP     58103979 A  *  6/1983  ............. H01R 35/00

*Primary Examiner* — Ibrahime A Abraham
*Assistant Examiner* — John J Norton
(74) *Attorney, Agent, or Firm* — Norton Rose Fulbright US LLP; Gerard Messina

(57) ABSTRACT

A heating apparatus for a MEMS sensor, comprising a metallic supply lead element for electric current; a metallic return lead element for electric current; and a defined number of metallic heating elements configured between the supply lead element and the return lead element, a substantially constant electrical current density being configurable in the supply lead element, in the return lead element, and in the heating elements.

16 Claims, 4 Drawing Sheets

(56) References Cited

U.S. PATENT DOCUMENTS

| | | | |
|---|---|---|---|
| 2005/0221062 A1* | 10/2005 | Mann | B32B 17/10018 |
| | | | 428/195.1 |
| 2006/0162831 A1* | 7/2006 | Ishida | B60C 11/0302 |
| | | | 152/209.18 |
| 2013/0146579 A1* | 6/2013 | Hiura | F23Q 7/001 |
| | | | 219/267 |
| 2013/0234140 A1* | 9/2013 | Schiller | B81B 3/0078 |
| | | | 257/48 |
| 2015/0123016 A1* | 5/2015 | Nagatani | G01J 3/108 |
| | | | 250/493.1 |

* cited by examiner

HEATING APPARATUS FOR A MEMS SENSOR

CROSS REFERENCE

The present application claims the benefit under 35 U.S.C. § 119 of German Patent Application No. DE 102015222072.9 filed on Nov. 10, 2015, which is expressly incorporated herein by reference in its entirety.

FIELD

The present invention relates to a heating apparatus for a MEMS sensor. The present invention further relates to a method for manufacturing a heating apparatus for a MEMS sensor.

BACKGROUND INFORMATION

Conventional metal-oxide-based gas sensors are used for the detection and quantification of various gases. These sensors typically require temperatures of up to 400° C. in order to function. In a MEMS embodiment, such sensors are often implemented with a silicon dioxide or silicon nitride diaphragm on which a heating element made of platinum or other materials is disposed. Reliability in this context is problematic, especially in conjunction with miniaturization of the sensors for use in mobile user devices such as smartphones.

In this connection, electromigration can represent a particularly relevant damage mechanism that can lead to rapid failure of the aforesaid heating structures as a result of design weaknesses. Miniaturization of the sensors and correspondingly of the conductor paths generally results in a higher current density and can aggravate the problems even more.

U.S. Pat. No. 6,450,025 B1 describes a micro-heating element having a layer structure with which distortion or warping of the micro-heating element can be limited.

U.S. Pat. No. 8,410,560 B2 describes a micro-heating plate with bidirectional current flow in order to reduce electromigration.

SUMMARY

An object of the present invention is to furnish an improved heating apparatus for a MEMS sensor.

According to a first aspect, the object may be achieved with a heating apparatus for a MEMS sensor, having:
a metallic supply lead element for electric current;
a metallic return lead element for electric current; and
a defined number of metallic heating elements configured between the supply lead element and the return lead element, a substantially constant electrical current density being configurable in the supply lead element, in the return lead element, and in the heating elements.

The result is to furnish a heating apparatus with which minimal current density divergences can be realized because of the homogeneous current density distribution. The result is that a service life of the heating apparatus can thereby be maximized, since damage due to electromigration is thereby greatly reduced. In addition, a heating characteristic for a MEMS sensor can be significantly improved by way of the heating apparatus.

According to a second aspect, the object may be achieved with a method for manufacturing a heating apparatus for a MEMS sensor, having the steps of:

furnishing a metallic supply lead element for electric current;
furnishing a metallic return lead element for electric current; and
disposing metallic heating elements between the supply lead element and the return lead element, such that the supply lead element, the return lead element, and the heating elements are configured in such a way that a substantially constant electrical current density is configurable in all the elements.

Preferred embodiments of the heating apparatus are described herein.

A preferred embodiment of the heating apparatus is characterized in that the supply lead element has a definedly decreasing width proceeding over a heating region; and that the return lead element has a definedly increasing width proceeding over the heating region. It is thereby possible to configure the current density to be substantially constant in all the elements recited.

A further preferred expression of the heating apparatus provides that the supply lead element and the return lead element are each, in the heating region, as wide as a total width of the heating elements disposed in a current flow direction. A general principle of a manufacturing specification for the heating apparatus is thereby furnished, with which the aforesaid effect regarding current density distribution can easily be implemented.

A further preferred embodiment of the heating apparatus provides that profiles of the widths of the supply lead element and of the return lead element are configured linearly, and the heating elements are configured to be of uniform width and to have a substantially identical spacing from one another. A particularly easily implemented principle for the individual elements of the heating apparatus is thereby furnished, with which simple manufacture of the heating apparatus is promoted.

A further preferred embodiment of the heating apparatus is notable for the fact that a homogeneous temperature distribution is configurable with the heating elements in the heating region. A sensing characteristic for a sensor can thereby be improved.

A further preferred embodiment of the heating apparatus provides that at least one electrically unconnected homogenization element having a definedly higher thermal conductivity than a diaphragm material is configured in the heating region for homogenization of a temperature distribution, the homogenization element being configured between two heating elements. The result, because of the fact that a diaphragm on which the heating apparatus is disposed is a poor thermal conductor, is that the temperature distribution in the heater region is homogenized on the diaphragm.

Further preferred embodiments of the heating apparatus are notable for the fact that the homogenization element is configured in angular or definedly rounded fashion. Different geometric shapes of homogenization elements, with which application-specific effects can be achieved, are thereby advantageously furnished.

Further preferred embodiments of the heating apparatus are characterized in that the heating elements are configured to be straight or definedly curved. Design versatility for the heating apparatus is thereby advantageously increased.

Further preferred embodiments of the heating apparatus are notable for the fact that the material of the heating apparatus is at least one of the following: platinum, ruthenium, platinum-ruthenium alloy, titanium, titanium oxide, platinum-titanium alloy, iridium, platinum-titanium-palladium alloy, platinum-zirconium oxide alloy. Different material-technology options with which the heating apparatus can be implemented are thereby furnished.

A further advantageous refinement of the heating apparatus provides that the supply lead element, the return lead element, and the heating elements are configured from the same material or are configured from different materials. In this manner as well, different material-technology options with which the heating apparatus can be implemented are furnished.

A preferred refinement of the heating apparatus is characterized in that the heating apparatus is configured in one piece. Manufacturing costs can thereby advantageously be minimized.

The present invention is described below in detail with further features and advantages, with reference to several figures. All disclosed features constitute the subject matter of the present invention, regardless of their presentation in the description and depiction in the Figures. Identical or functionally identical elements have identical reference characters. The Figures are intended in particular to illustrate the features of the present invention and are not necessarily depicted at exact scale.

Disclosed method features result analogously from corresponding disclosed apparatus features and vice versa. This means in particular that features, technical advantages, and embodiments relating to the heating apparatus result in analogous fashion from corresponding embodiments, features, and advantages of the method for manufacturing the heating apparatus, and vice versa.

DETAILED DESCRIPTION OF EXAMPLE EMBODIMENTS

An aspect of the present invention involves furnishing a specific design for a heating element or heating apparatus for gas sensors or other applications having micro-heating devices, which design is largely resistant to electromigration and thereby promotes a longer service life and greater reliability of the gas sensors.

Provision is made in particular to implement a specific shape of a thin-layer metal heating element for a MEMS gas sensor. The heating element is implemented on a diaphragm, and is responsible for reaching the temperature necessary for the chemical reactions. The proposed heating element can, however, also advantageously be utilized in other, in particular chemical, sensor elements that require an elevated operating temperature and/or permit a similar structure.

Figure 1:
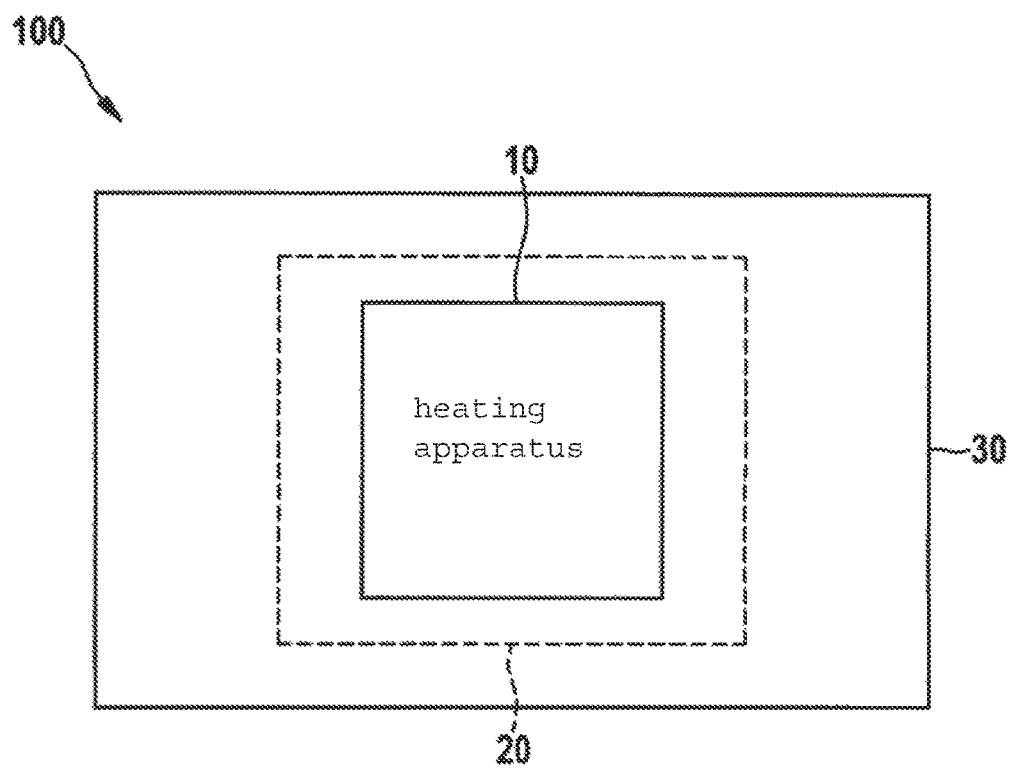
FIG. 1 is a schematic plan view depicting a heating region of a MEMS gas sensor.

A generalized MEMS sensor 100 is depicted in FIG. 1 in a schematic plan view. It encompasses a chip or support 30 on which a diaphragm 20 is applied. The chip material is removed from the back side in a specific region of support 30, so that diaphragm 20 is configured in this region. The heating element or heating apparatus 10 is configured on diaphragm 20.

Figure 2:
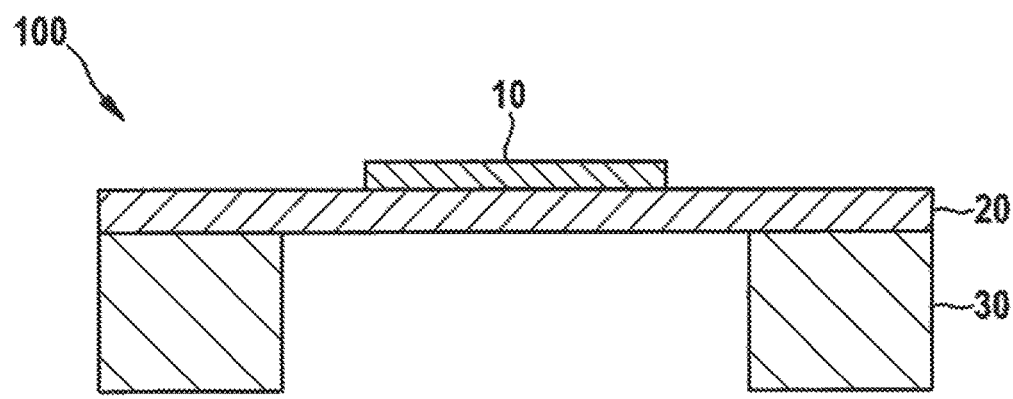
FIG. 2 is a schematic cross-sectional view depicting a heating region of a MEMS gas sensor.

FIG. 2 shows the basic structure of FIG. 1 in a cross-sectional view.

Conventional heating elements configured as folded ribbons (e.g. in an S-shape) exhibit a damage mechanism in the form of electromigration. A specific geometric conformation of heating apparatus 10 is proposed in order to compensate for this undesired electromigration, which is expressed as undesirable material erosion sites (voids) that can ultimately result in breakages.

An aspect of the present invention involves furnishing a specific design for a thin-layer heater made of a metal or of other low-resistance materials having the ability to reach temperatures of at least 400° C. The heater can be disposed on a diaphragm or other disengaged structures made of silicon dioxide or silicon nitride or another material or stack of materials, which are electrically insulated at least on the surface and generally exhibit poor thermal conductivity. The heater can be manufactured using a variety of MEMS manufacturing methods or other thin-layer methods. The heater can be covered by a protective layer that has properties similar or identical to those of the diaphragm.

Advantageously, with a sensor having the proposed heating apparatus, influences of electromigration can be largely compensated for and a service life of the MEMS sensor can be significantly extended.

The present invention thus advantageously enables a homogeneous, i.e., maximally divergence-free, current density distribution in the heating apparatus. The service life and reliability of the MEMS sensor as a whole can thereby advantageously be enhanced.

Figure 3:
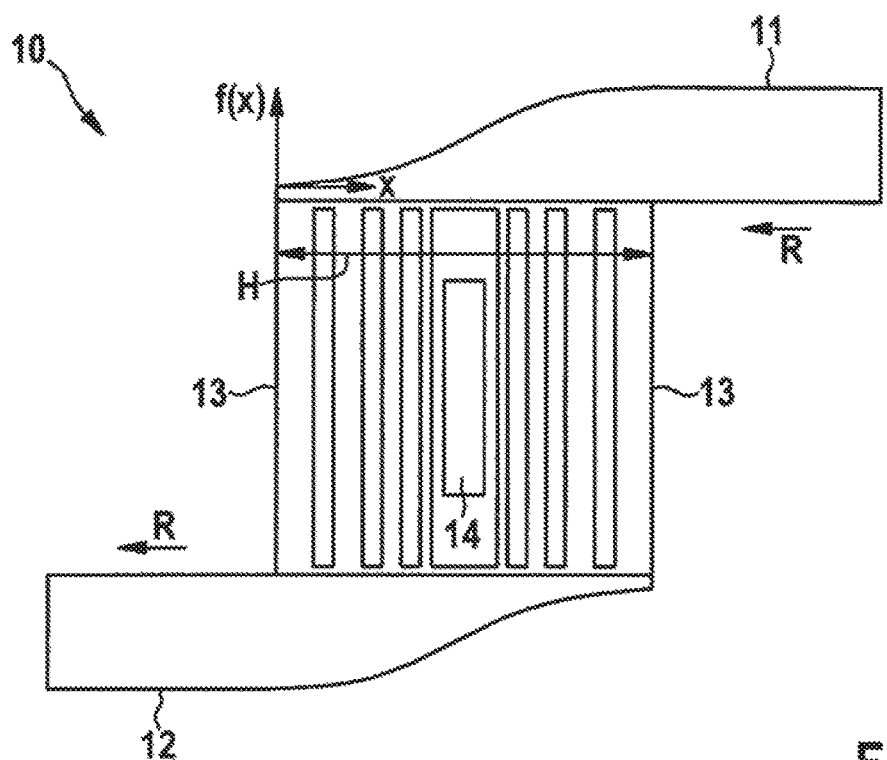
FIG. 3 schematically depicts a first embodiment of the heating apparatus according to the present invention.

A first embodiment of heating apparatus 10 according to the present invention, which is implemented on support 30 (not depicted) having diaphragm 20 (not depicted), is depicted in plan view in FIG. 3. Heating apparatus 10 encompasses a metallic supply lead element 11 and a metallic return lead element 12, which preferably are configured from platinum. Several heating elements 13 are disposed between supply lead element 11 and return lead element 12. Supply lead element 11, return lead element 12, and heating elements 13 are preferably made of the same material (same thin-layer plane, a thickness of the metal being equal to approx. 100 nm to approx. 800 nm), which can be deposited simultaneously and patterned simultaneously. Supply lead element 11, return lead element 12, and heating elements 13 are preferably configured in one piece, but alternatively can also be configured as separate elements connected to one another.

The "supply lead" and "return lead" functions are usable hereinafter interchangeably; a partial functional overlap is also possible, so that supply lead elements 11 can always also function at least in part as return lead elements 12 and vice versa.

Heating elements 13 carry the electrical heating current from supply lead element 11 to return lead element 12, and serve for heat generation in a heating region H. Heating region H can be approx. 20 µm to approx. 500 µm in size. A current flow direction R, proceeding from top right into supply lead element 11 and proceeding out of return lead element 12 at bottom left, is evident. In a normal operating mode, electric current is fed into supply lead element 11, then travels through heating elements 13, and is discharged via return lead element 12. Thermal heat development, which is provided for heating of a diaphragm, for example a diaphragm of a MEMS gas sensor, is thereby generated in heating region H.

It is evident that a width of supply lead 11 becomes definedly less in the course of current flow direction R. An exact shape f(x) is adapted to the geometry of heating elements 13 in such a way that a homogeneous electrical current density distribution is achieved. Correspondingly thereto, a width of return lead element 12 increases in current flow direction R. A width of the individual heating elements 13, and their spacing from one another, are selected so as to produce the largest possible region having a homogeneous temperature. Supply lead element 11 and return lead element 12 are shaped, and are adapted to the geometry of heating elements 13, in such a way that the electrical current density is substantially constant everywhere.

It is thereby possible, as a result, to keep the electrical current densities in supply lead element 11 and in return lead element 12 substantially constant, so that an electromigration effect can advantageously be minimized or eliminated.

Numerous advantages can be achieved with such a geometry:
  A constant and homogeneous current density over the entire heating apparatus, which results in a reduction in electromigration damage due to current density divergences.
  A capability of adapting the heating output density over the heating region, which is achieved by way of the variable width and spacing of the heating elements.
  Thanks to the two aforesaid aspects, the electrical current density in the heating apparatus can be increased generally, thereby enabling smaller designs, which advantageously promotes miniaturization of the entire sensor.

Suitable materials for the aforesaid elements 11, 12, 13 are, for example: ruthenium, platinum-ruthenium alloy, titanium, titanium oxide, platinum-titanium alloy, iridium, platinum-titanium-palladium alloy, platinum-zirconium oxide alloy.

It is furthermore evident that the widths and spacings of heating elements 13 can additionally be varied in order to increase the temperature homogeneity in heating region H. The approach typically taken here is to dissipate more power/heat in the peripheral regions.

Also evident for this purpose is a homogenization element 14, provided between two heating elements 13, which is electrically unconnected to heating elements 13 and serves to improve or equalize a heating effect in heating region H. Several homogenization elements 14 can preferably be provided, each homogenization element 14 having a definedly higher thermal conductivity than a material of diaphragm 20 so as thereby to promote homogenization of a temperature distribution.

In other embodiments that are not depicted, homogenization elements 14 can have round or rounded shapes or can represent a segment of a ring.

Figure 4:
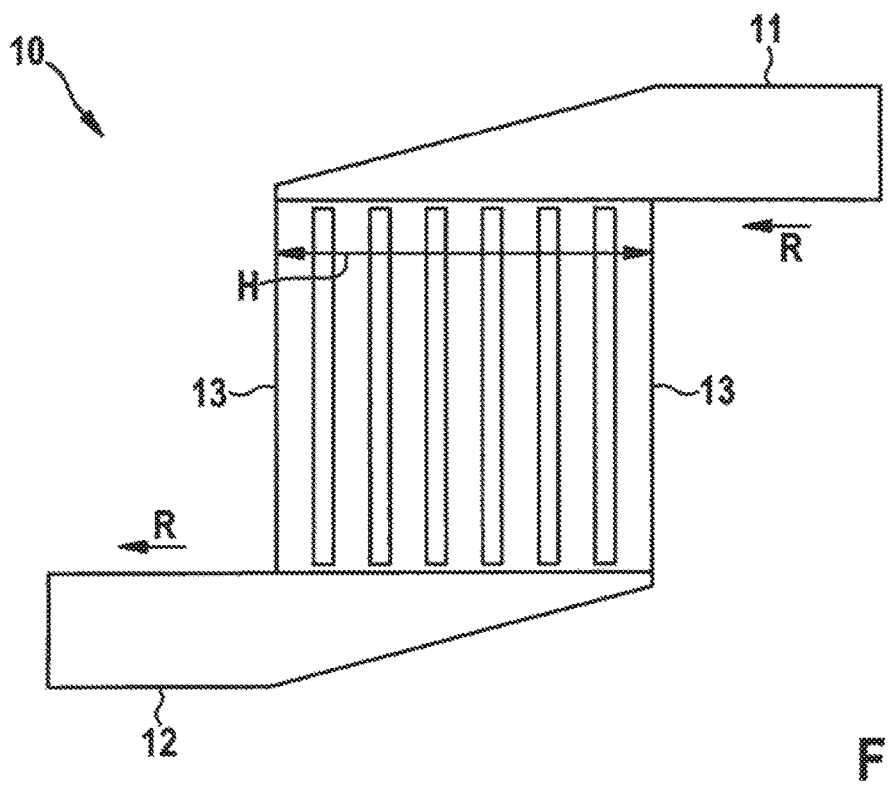
FIG. 4 schematically depicts a further embodiment of the heating apparatus according to the present invention.

FIG. 4 shows a further embodiment of a heating apparatus 10 according to the present invention. This variant as well encompasses a supply lead element 11 and a return lead element 12; it is evident that the width along heating region H decreases uniformly, and that a width of heating element 13 is constant over the entire heating region H. Heating elements 13 are configured with substantially the same spacing from one another. The result is to produce a homogeneous current density in lead elements 11, 12 and in heating region H. Current density divergences are thereby largely avoided, and the service life can advantageously be extended.

In a further embodiment (not depicted in the Figures) of heating apparatus 10, the right-angled corners at the anchor points of heating elements 13 on elements 11, 12 can be rounded off in order to avoid a local concentration of electric current in that region and to further increase reliability.

Figure 5:
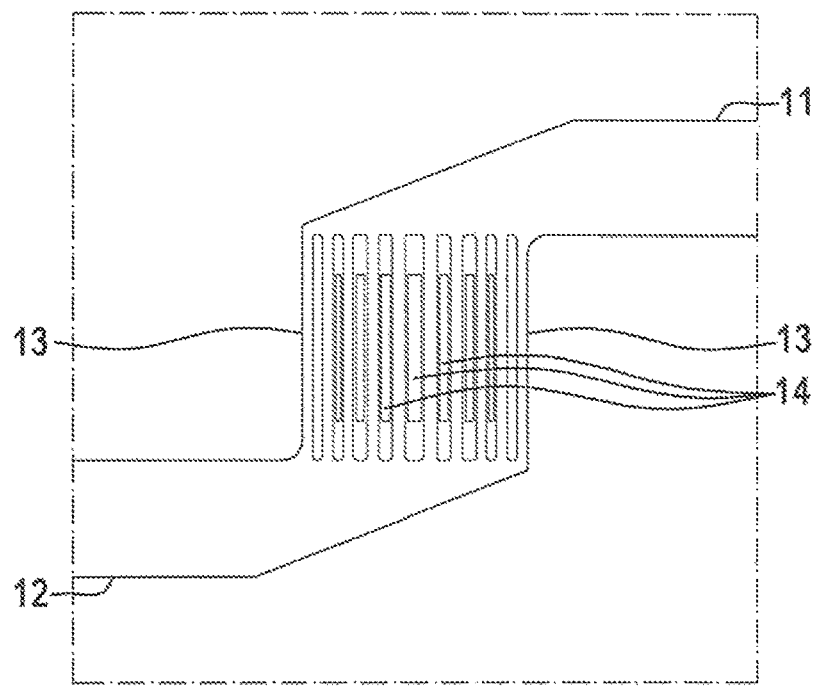
FIG. 5 schematically depicts an effect that is achievable with the heating apparatus.

FIG. 5 shows a current density distribution in heating apparatus 10, based on a simulation. Very good current density homogeneity is apparent from the uniform hatching.

Figure 6:
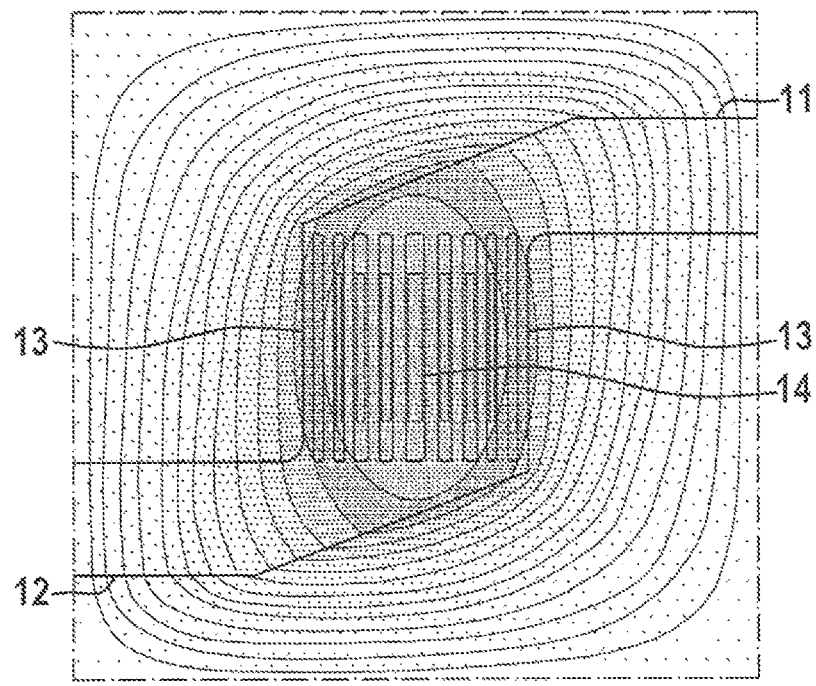
FIG. 6 schematically depicts a heat distribution that is achievable with the heating apparatus.

FIG. 6 shows a temperature distribution that is achievable with heating apparatus 10; it is evident that sufficient homogeneity of thermal energy exists in a central region that corresponds substantially to heating region H, a temperature deviation being equal to only approx. 10% to 15%. The temperature is approximately 430° C. in the central region and approximately 22° C. in the peripheral regions.

Figure 7:
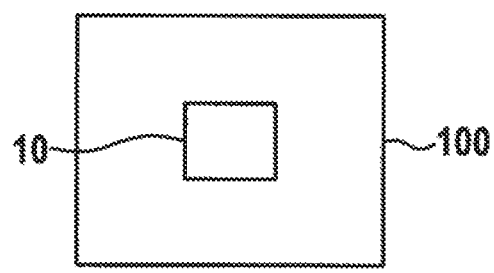
FIG. 7 is a simplified block diagram of a sensor having the heating apparatus.

FIG. 7 is a highly simplified depiction of a MEMS sensor 100 having the proposed heating apparatus 10. MEMS sensor 100 is preferably configured as a MEMS gas sensor.

Figure 8:
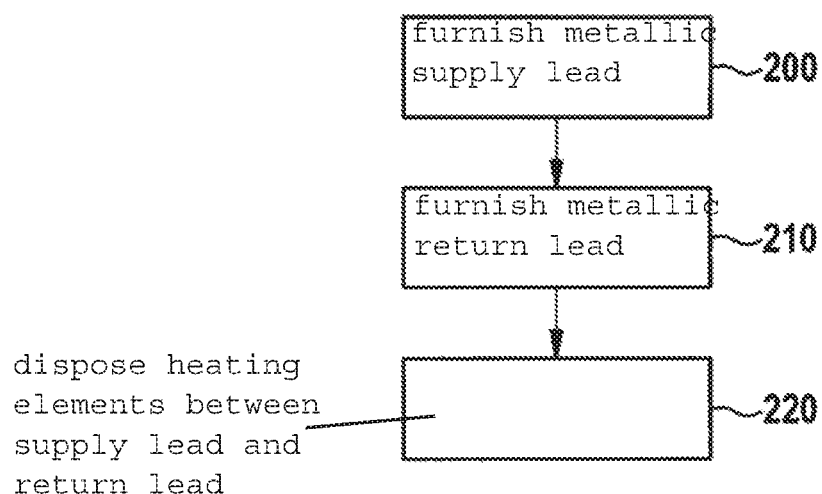
FIG. 8 schematically shows execution of an embodiment of the method according to the present invention.

FIG. 8 schematically shows execution of an embodiment of the method according to the present invention.

In a step 200, a metallic supply lead element 11 for electric current is furnished.

In a step 210, a metallic return lead element 12 for electric current is furnished.

Lastly, in a step 220, metallic heating elements 13 are disposed between supply lead element 11 and return lead element 12; supply lead element 11, return lead element 12, and heating elements 13 are configured in such a way that a substantially constant electrical current density is configurable in all the elements 11, 12, 13.

In summary, the present invention proposes a heating apparatus in particular for a MEMS-based chemical sensor (e.g. for a sensor for $CO_2$, $CO$, $O_2$, etc.), which apparatus is disposed on a support having a diaphragm. The heating apparatus has a homogeneous or divergence-minimized or divergence-free current density distribution, with the result that damage caused by electromigration can advantageously be minimized.

The exact shape of the aforesaid lead elements is adapted to the geometry of the heating elements. Parameters of the heating elements (e.g., spacings, shape, etc.) are selected in such a way that the temperature distribution in the heating region is maximally homogeneous.

The design furthermore offers expanded possibilities for increasing temperature homogeneity, since maximum permitted current gradients do not constitute a limitation for that purpose; a new degree of freedom is thereby opened up, and dependence between different design aspects is reduced. The result is that a further shrinking of the heater structure is thereby possible, resulting overall in smaller and more energy-saving sensors that are particularly suitable for use in mobile user devices.

Since the present invention makes possible the use of electrically highly conductive materials at very high current densities, low electrical voltages (less than 1.5 V) for operating the heater are thereby made possible. The result is that electronic elements to increase voltage are not necessary, as would be the case with semiconductor switching elements (for example, doped silicon or silicon carbide); advantageously, costs can thereby be reduced.

Advantageously, the present invention can also be applied to other sensor elements of similar construction.

Although the present invention has been described above with reference to specific utilization examples, one skilled in the art can in this instance, without deviating from the essence of the present invention, also implement embodiments that are not, or are only partly, disclosed.

What is claimed is:

1. A heating apparatus for a MEMS sensor, comprising:
a metallic supply lead element for electric current;
a metallic return lead element for electric current; and
a defined number of metallic heating elements configured between the supply lead element and the return lead element, a constant electrical current density being configurable in the supply lead element, in the return lead element, and in the heating elements;
wherein the heating apparatus is for the MEMS sensor,
wherein the supply lead element, on one side of the heating elements, has a definedly decreasing width proceeding in a direction of a current flow over a heating region, and the return lead element, on an opposite side of the heating elements, has a definedly increasing width proceeding in the direction of the current flow over the heating region, and
wherein the supply lead element and the return lead element have a reverse symmetry.

2. The heating apparatus as recited in claim 1, wherein the supply lead element and the return lead element are each, in the heating region, as wide as a total width of the heating elements disposed in the current flow direction.

3. The heating apparatus as recited in claim 1, wherein profiles of the widths of the supply lead element and of the return lead element are configured linearly, and the heating elements are configured to be of uniform width and to have a spacing from one another which is approximately the same.

4. The heating apparatus as recited in claim 1, wherein a homogeneous temperature distribution is configurable with the heating elements in the heating region.

5. The heating apparatus as recited in claim 1, wherein at least one electrically unconnected homogenization element having a definedly higher thermal conductivity than a diaphragm material is configured in the heating region for homogenization of a temperature distribution, the homogenization element being configured between two heating elements.

6. The heating apparatus as recited in claim 5, wherein the homogenization element is configured in an angular or definedly rounded fashion.

7. The heating apparatus as recited in claim 1, wherein the heating elements are straight or definedly curved.

8. The heating apparatus as recited in claim 1, wherein the material of the heating apparatus is at least one of the following: platinum, ruthenium, platinum-ruthenium alloy, titanium, titanium oxide, platinum-titanium alloy, iridium, platinum-titanium-palladium alloy, platinum-zirconium oxide alloy.

9. The heating apparatus as recited in claim 8, wherein the supply lead element, the return lead element, and the heating elements are configured from the same material.

10. The heating apparatus as recited in claim 8, wherein the supply lead element, the return lead element, and the heating elements are configured from different materials.

11. The heating apparatus as recited in claim 1, wherein the heating apparatus is configured in one piece.

12. The heating apparatus as recited in claim 1, wherein an exact shape as function of a distance is adapted to a geometry of the heating elements so that there is a homogeneous electrical current density distribution.

13. A MEMS sensor, comprising:
a heating apparatus disposed on a diaphragm, the heating apparatus including a metallic supply lead element for electric current, a metallic return lead element for electric current, and a defined number of metallic heating elements configured between the supply lead element and the return lead element;
wherein an electrical current density, which is approximately constant, is configurable in the supply lead element, in the return lead element, and in the heating elements, and
wherein the supply lead element, on one side of the heating elements, has a definedly decreasing width proceeding in a direction of a current flow over a heating region, and the return lead element, on an opposite side of the heating elements, has a definedly increasing width proceeding in the direction of the current flow over the heating region, and
wherein the supply lead element and the return lead element have a reverse symmetry.

14. The heating apparatus as recited in claim 13, wherein a width of the return lead element increases in the current flow direction, wherein a width of the heating elements, and their spacing from one another, are selected so as to produce a maximum region having a homogeneous temperature, and wherein the supply lead element and the return lead element are shaped, and are adapted to the geometry of the heating elements, so that the electrical current density is approximately constant everywhere.

15. A method for manufacturing a heating apparatus for a MEMS sensor, the method comprising:
furnishing a metallic supply lead element for electric current;
furnishing a metallic return lead element for electric current; and
disposing metallic heating elements between the supply lead element and the return lead element, the supply lead element, such that the return lead element, and the heating elements are configured so that an electrical current density, which is approximately constant, is configurable in all the elements;
wherein the supply lead element, on one side of the heating elements, has a definedly decreasing width proceeding in a direction of a current flow over a heating region, and the return lead element, on an opposite side of the heating elements, has a definedly increasing width proceeding in the direction of the current flow over the heating region, and
wherein the supply lead element and the return lead element have a reverse symmetry.

16. A method of using a heating apparatus, the method comprising:
providing a heating apparatus, the heating apparatus including a metallic supply lead element for electric current, a metallic return lead element for electric current, and a defined number of metallic heating elements configured between the supply lead element and the return lead element, a constant electrical current density, which is approximately constant, is configurable in the supply lead element, in the return lead element, and in the heating elements; and
using the heating apparatus in a MEMS gas sensor;
wherein the supply lead element, on one side of the heating elements, has a definedly decreasing width proceeding in a direction of a current flow over a heating region, and the return lead element, on an opposite side of the heating elements, has a definedly increasing width proceeding in the direction of the current flow over the heating region, and wherein the supply lead element and the return lead element have a reverse symmetry.

* * * * *